United States Patent [19]
Fazan et al.

[11] Patent Number: 5,281,549
[45] Date of Patent: Jan. 25, 1994

[54] PROCESS FOR FABRICATING A STACKED CAPACITOR HAVING AN I-SHAPED CROSS-SECTION IN A DYNAMIC RANDOM ACCESS MEMORY ARRAY

[75] Inventors: Pierre Fazan; Hiang C. Chan, both of Boise, Id.

[73] Assignee: Micron Technology, Inc., Boise, Id.

[21] Appl. No.: 985,973

[22] Filed: Dec. 4, 1992

Related U.S. Application Data

[62] Division of Ser. No. 692,859, Apr. 29, 1991, abandoned.

[51] Int. Cl.$^5$ .................. H01L 21/70; H01L 27/00
[52] U.S. Cl. ........................ 437/52; 437/60; 437/919
[58] Field of Search ................ 437/52, 60, 919

[56] References Cited

U.S. PATENT DOCUMENTS

| | | | |
|---|---|---|---|
| 4,742,018 | 5/1988 | Kimura et al. | 437/48 |
| 5,102,820 | 4/1992 | Chiba | 437/52 |
| 5,108,943 | 4/1992 | Sandhu et al. | 437/52 |
| 5,155,057 | 10/1992 | Dennison et al. | 437/52 |

OTHER PUBLICATIONS

"A Novel Storage Capacitance Enlargement Structure Using a Double-Stacked Storage Node in STC DRAM Cell", T. Kisu et al., Extended Abst of the 20th Conf. Solid State Device and Materials, Tokyo (1988), pp. 581–584.

"3-Dimensional Stacked Capacitor Cell for 16M and 64M DRAMS" by T. Ema et al., IEDM (1988), pp. 592–595.

Primary Examiner—Olik Chaudhuri
Assistant Examiner—H. Jey Tsai
Attorney, Agent, or Firm—David J. Paul

[57] ABSTRACT

An existing stacked capacitor fabrication process is modified to construct a three-dimensional stacked capacitor, referred to as a Stacked I-Cell (SIC). The SIC design defines a capacitor storage cell that in the present invention is used in a DRAM process. The SIC is made up of a polysilicon storage node structure having a I-shaped cross-sectional upper portion with a lower portion extending downward and making contact to an active area via a buried contact. The polysilicon storage node structure is overlaid by polysilicon with a dielectric sandwiched in between to form a completed SIC capacitor. The novel 3-dimensional shaped polysilicon storage node plate having an adjustable I-shaped cross-section, allows substantial capacitor plate surface area of 200% or more to be gained at the storage node over that of a conventional STC.

18 Claims, 12 Drawing Sheets

PROCESS FOR FABRICATING A STACKED CAPACITOR HAVING AN I-SHAPED CROSS-SECTION IN A DYNAMIC RANDOM ACCESS MEMORY ARRAY

CROSS-REFERENCE TO RELATED APPLICATION

This is a divisional to U.S. patent application Ser. No. 07/692,859 filed Apr. 29, 1991, now abandoned.

FIELD OF THE INVENTION

This invention relates to semiconductor circuit memory storage devices and more particularly to a process for fabricating three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by T. Ema, et al., entitled "3-DIMENSIONAL STACKED CAPACITOR CELL FOR 16M AND 64M DRAMS," IEDM, Dig. Tech. Papers, pp. 592–595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by T. Kisu et al., entitled "A Novel Storage Capacitance Enlargement Structure Using a Double-Stacked Storage Node in STC DRAM Cell," Ext. Abst., 20th Conf. on S.S.D.M., pp. 582–584, 1988, herein incorporated by reference, discusses a double-stacked storage node (developed from a conventional STC structure) running parallel to word lines. The development of the double-stacked storage node discussed in the above article, requires two additional photomask steps to that of a conventional STC process. By referring to FIG. 1a on page 582, it can be seen that a first photomask step is needed to form a buried contact between the first storage node and the underlying substrate. A second photomask step is then required to pattern the 1st storage node. Now referring to FIG. 1b, a third photomask step is needed to provide an opening through the $SiO_2$ and $Si_2N_4$ dielectric layers allowing access to the 1st storage node. Then a fourth photomask step is required to pattern the 2nd storage node which connects to the 1st storage node.

The present invention further develops an existing stacked capacitor fabrication process by adding only one photolithography step to construct a three-dimensional stacked capacitor cell. The capacitor's bottom plate (or storage node plate) is running parallel to digit lines and is connected to an access transistor's active area by a is self-aligned buried contact (or node contact). Additionally, the storage node does not need to be critically aligned on the node contact which allows the manufacture of a smaller cell area for a given lithographic resolution.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked capacitor, referred to hereinafter as a Stacked I-Cell (SIC). The SIC design defines a capacitor storage cell that in the present invention is used in a DRAM process, however it will be evident to one skilled in the art to incorporate these steps into other processes requiring memory cells such as VRAMs or the like.

After a silicon wafer is prepared using conventional process steps, the present invention develops the SIC by depositing and patterning two interconnecting layers of polysilicon separating at specific areas to form the storage node structure having an I-shaped cross-section running parallel to digit lines. The entire I-shaped structure conforms to the wafer's topography formed by two adjacent digit lines running perpendicular to and over the top of three adjacent word lines, thus resulting in increased capacitor plate surface area for each storage cell. Such a structure is a vast improvement over the

3

STC cell by maximizing the area available for a storage node.

DETAILED DESCRIPTION OF THE PREFERRED EMBODIMENT

The invention is directed to maximizing storage cell surface area in a high density/high volume DRAM fabrication process, in a sequence shown in FIGS. 1-11.

A silicon wafer is prepared using conventional process steps up to the point of defining a cell array. Fabrication of word lines, digit lines and a capacitor cell of the present invention will now follow.

The capacitor of each cell will make contact with a buried contact within the cell, while the capacitor will extend to the active area of an adjacent cell. Each active area within the array is isolated from one another by a thick field oxide. The active areas can be arranged in interdigitated columns and non-interdigitated rows or simply parallel and in line to one another in both the vertical and horizontal directions. The active areas are used to form active MOS transistors that can be doped as NMOS or PMOS type FETs depending on the desired use.

Figure 1:
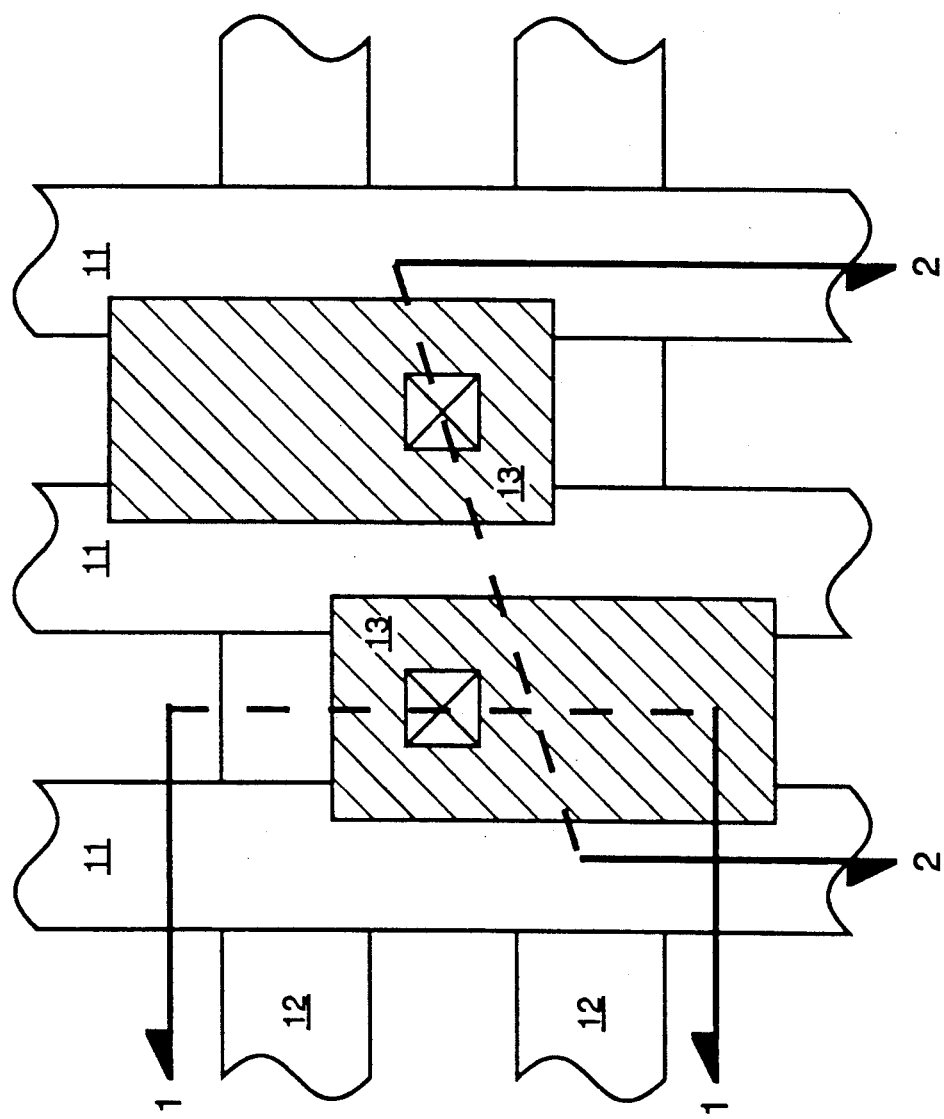
FIG. 1 is a top planar view of a portion of an in-process wafer showing digit lines, word lines and storage capacitors.

FIG. 1 shows a top planar view portion of a completed multilayered memory array with the main building blocks comprising digit lines 11, word lines 12 and a storage node plate 13 of a SIC capacitor.

Figure 2:
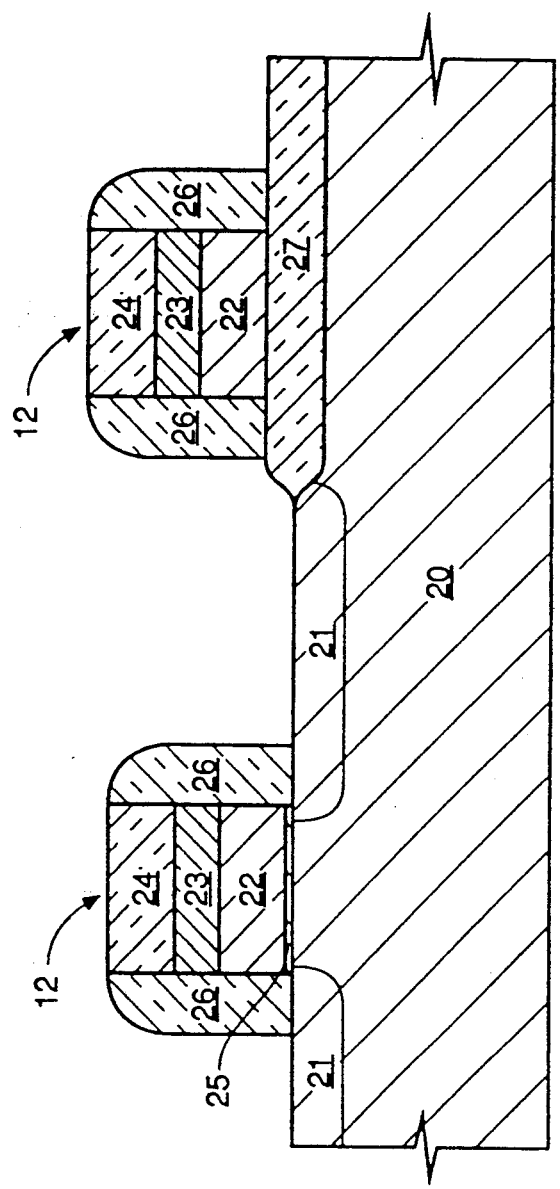
FIG. 2 is a cross-sectional view through broken line 1—1 of FIG. 1.

As shown in FIG. 2, poly 22, covered with silicide 23 and dielectric 24 (either oxide or nitride) are patterned to serve as word lines 12. Silicide 23 may be selected from such silicides as tungsten silicide (WSi$_2$), titanium silicide (TiSi$_2$) or the like. Poly 22 is conductively doped in order to combine with silicide 23 to form the conductor for word lines 12. Word lines 12 are further isolated from one another as well as subsequent conductive layers by dielectric spacers 26 (also either oxide or nitride). Word lines 12 have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to and over word lines 12.

Figure 3:
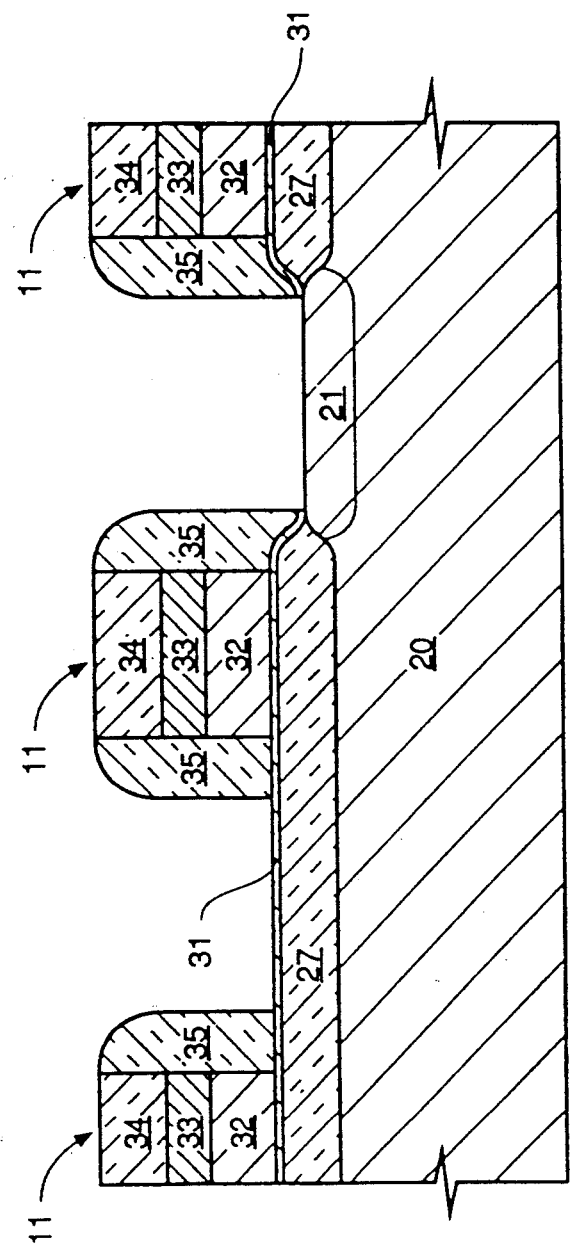
FIG. 3 is a cross-sectional view through broken line 2—2 of FIG. 1.

FIG. 3 shows the formation of digit lines 11. A conformal layer of dielectric 31 is deposited over the existing wafer surface to isolate previously formed active areas 21 from the subsequent formation of digit lines 11. First, buried digit line contacts are patterned and etched through dielectric 31 allowing access to active areas 21 at the desired locations (the buried digit line contacts cannot be seen in the cross-section of FIG. 3). Second, digit lines 11 are made up of patterned layers consisting of polysilicon 32, silicide 33 and dielectric 34 following the location of the buried digit line contacts. Dielectric 34 can be either nitride or oxide and is deposited by chemical vapor deposition (CVD) which is preferred for its excellent conformity. Polysilicon 32 has previously been conductively doped to electrically couple with silicide 33 to serve as the conductor for digit lines 11. Silicide 33 may be selected from such silicides as tungsten silicide (WSi$_2$), titanium silicide (TiSi$_2$) or the like. Digit lines 11 run perpendicular to and over the top of word lines 12 (shown in FIG. 2) and conform to the wafer surface resulting in a waveform-like topology running in both the digit line and word line directions. A second dielectric, such as nitride or oxide is now deposited, followed by an anisotropic etch to form vertical dielectric spacers 35.

Figure 4:
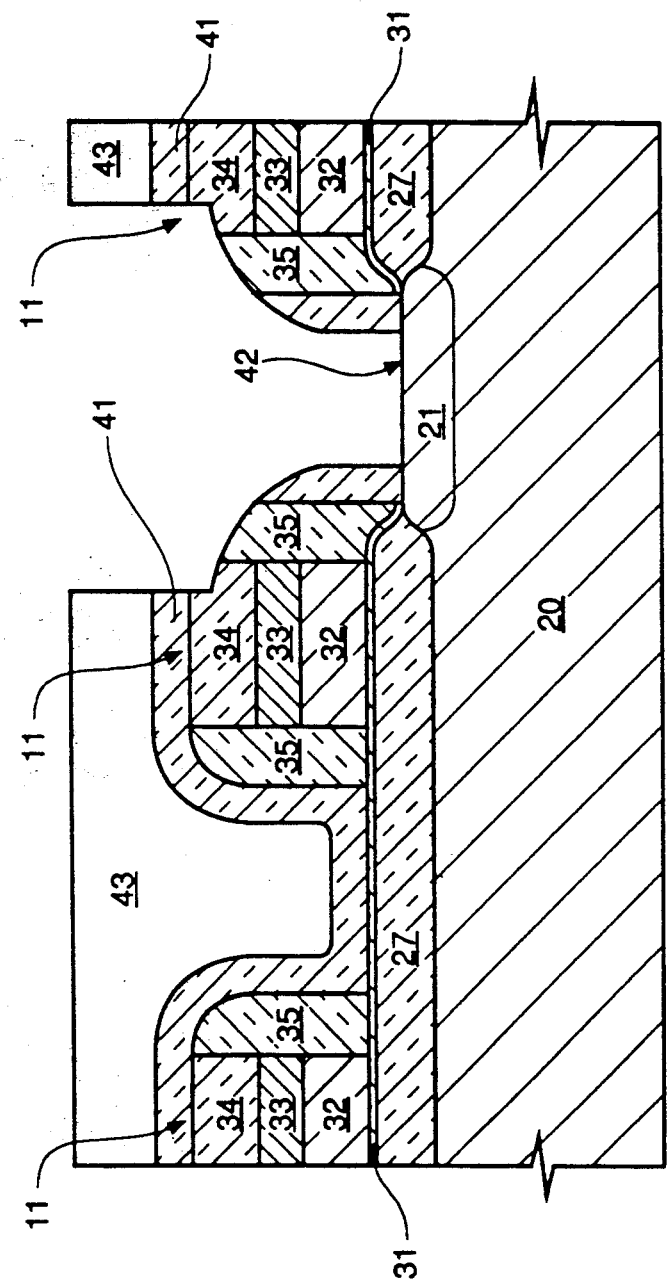
FIG. 4 is a cross-sectional view of the in-process wafer portion of FIG. 3 after a conformal dielectric deposition over existing digit lines followed by a buried contact photo and etch.

As shown in FIG. 4, digit lines 11 and their subsequent isolation layers are then covered with dielectric 41 to a preferred thickness of 500 to 2,000 angstroms preferably by CVD. Dielectric 41 may also be either nitride or oxide depending on the process used. Following dielectric 41 deposition, buried contact 42 is aligned to digit lines 11 by covering all of the wafer surface area with photoresist 43. After applying an appropriate photomask, a buried contact anisotropic etch provides an opening to locate contact 42.

Up to this point, process flow has followed that of an array comprising conventional stacked capacitor cells. From this point forward, the process is unique to an array having SIC-type storage capacitors.

Figure 5:
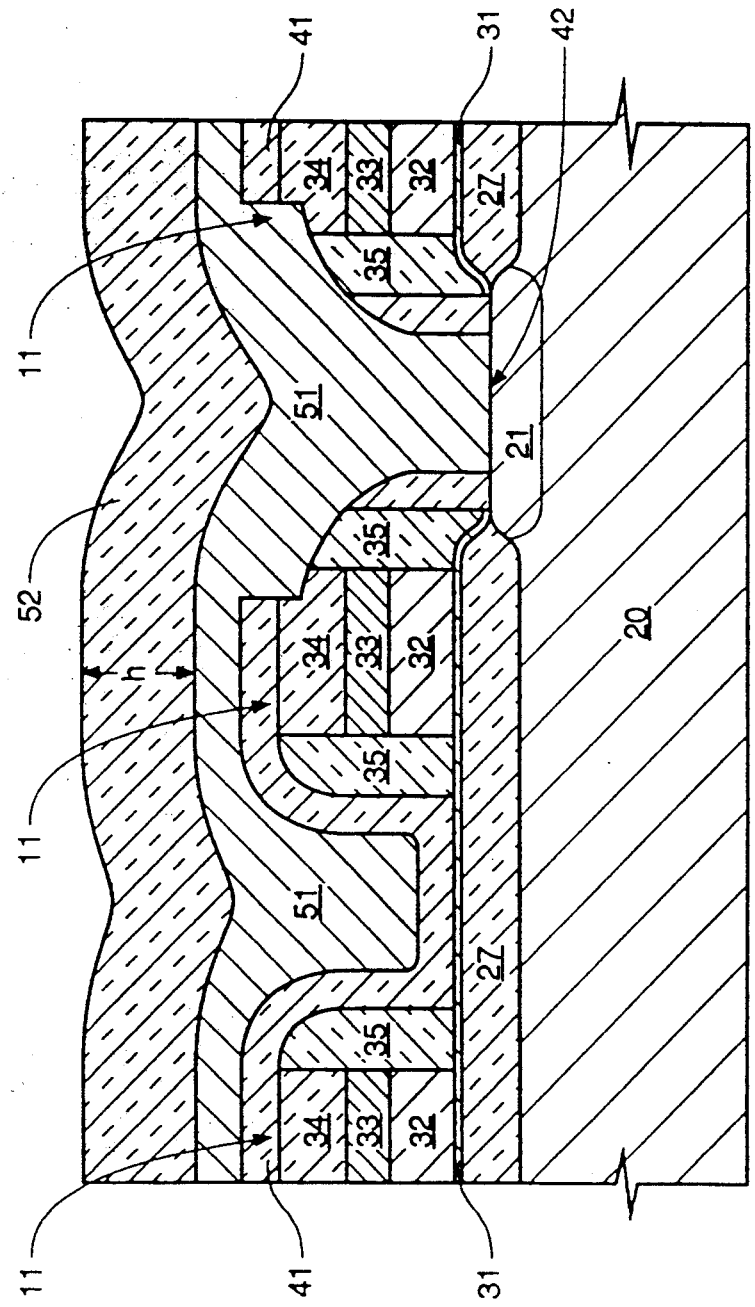
FIG. 5 is a cross-sectional view of the in-process wafer portion of FIG. 4 after a first polysilicon deposition, planarization and dopi_ ollowed by a thick deposition of a first oxide.

As shown in FIG. 5, the photoresist 43 (of FIG. 4) has been stripped and a thick layer of conformal polysilicon 51 is deposited and planarized. Conformal poly layer 51 connects to active area 21 via buried contact 42. Polysilicon 51 is now doped to the desired conductivity type (p-type or n-type). Following poly 51 doping, a conformal layer of thick oxide 52 is deposited, preferably by CVD. The height of oxide 52 deposited is controlled as it plays an important role in determining the overall surface area of the SIC to be completed later in the process.

Figure 6:
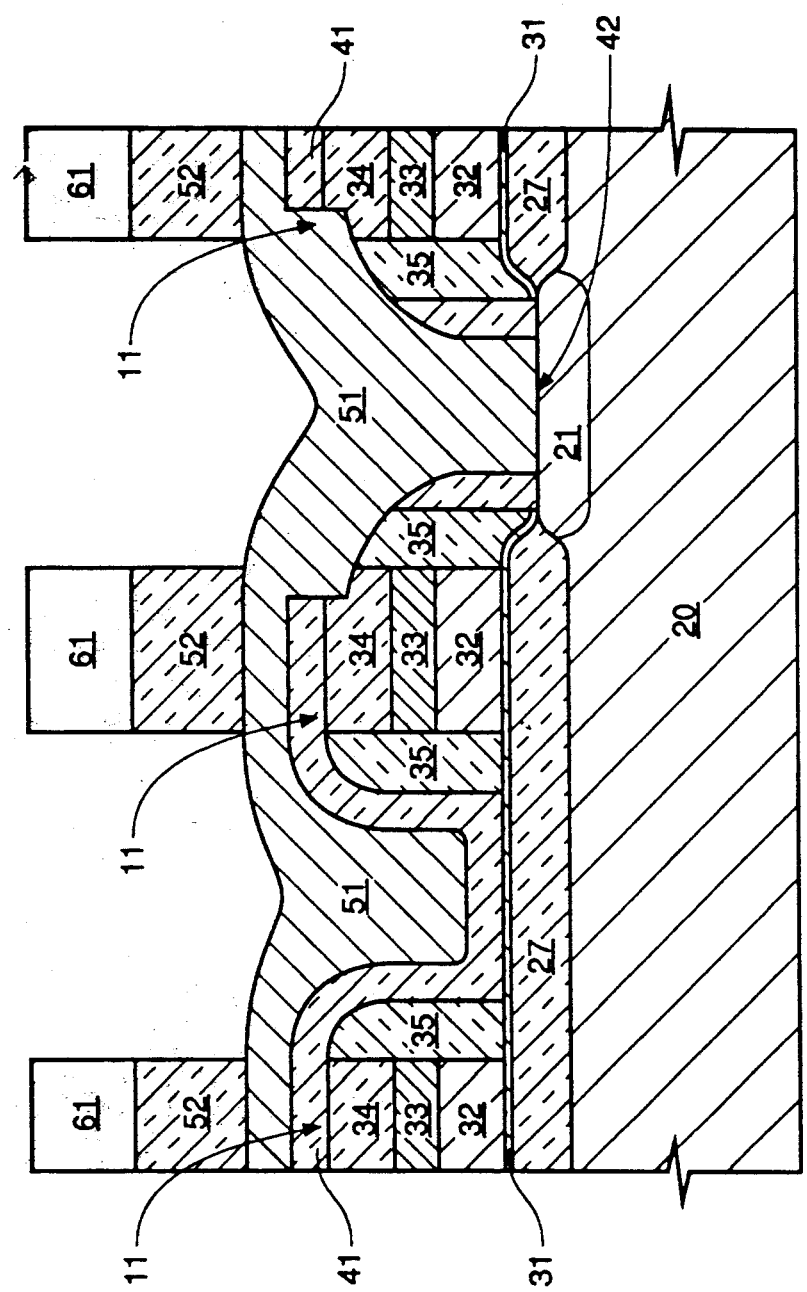
FIG. 6 is a cross-sectional view of an in-process wafer portion after a patterning and etch of the first oxide.

As shown in FIG. 6, oxide 52 is patterned, preferably to align directly over digit lines 11, by applying an appropriate photomask to photoresist 61 and etching away the exposed oxide 52.

Figure 7:
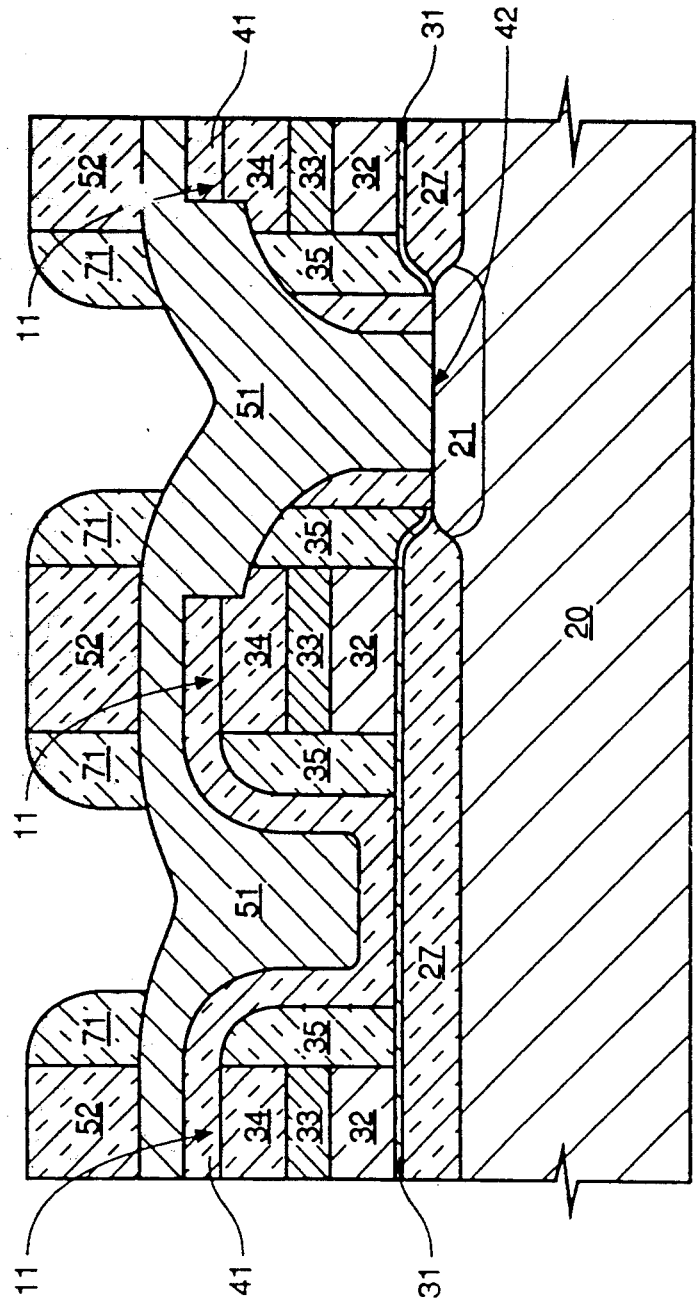
FIG. 7 is a cross-sectional view of the in-process wafer portion of FIG. 6 after a photoresist strip, a second oxide deposition and second oxide spacer etch.

As shown in FIG. 7, photo resist 61 (of FIG. 6) has been stripped and a layer of oxide is deposited, preferably by CVD, followed by an oxide etch to form oxide spacers 71.

Figure 8:
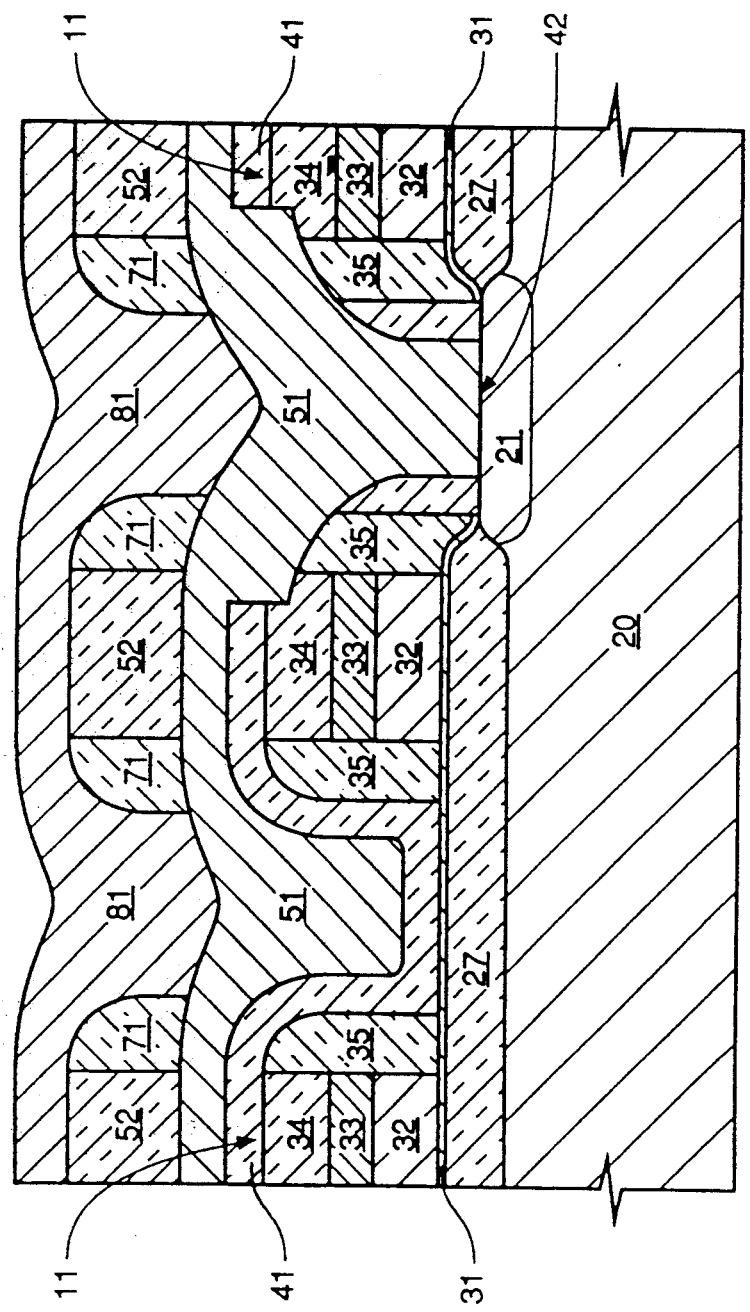
FIG. 8 is a cross-sectional view of the in-process wafer portion of FIG. 7 following a conformal deposition and doping of a second polysilicon.

As shown in FIG. 8, polysilicon layer 81 is deposited and conductively doped thereby connecting doped polysilicon 81 to doped polysilicon 51.

Figure 9:
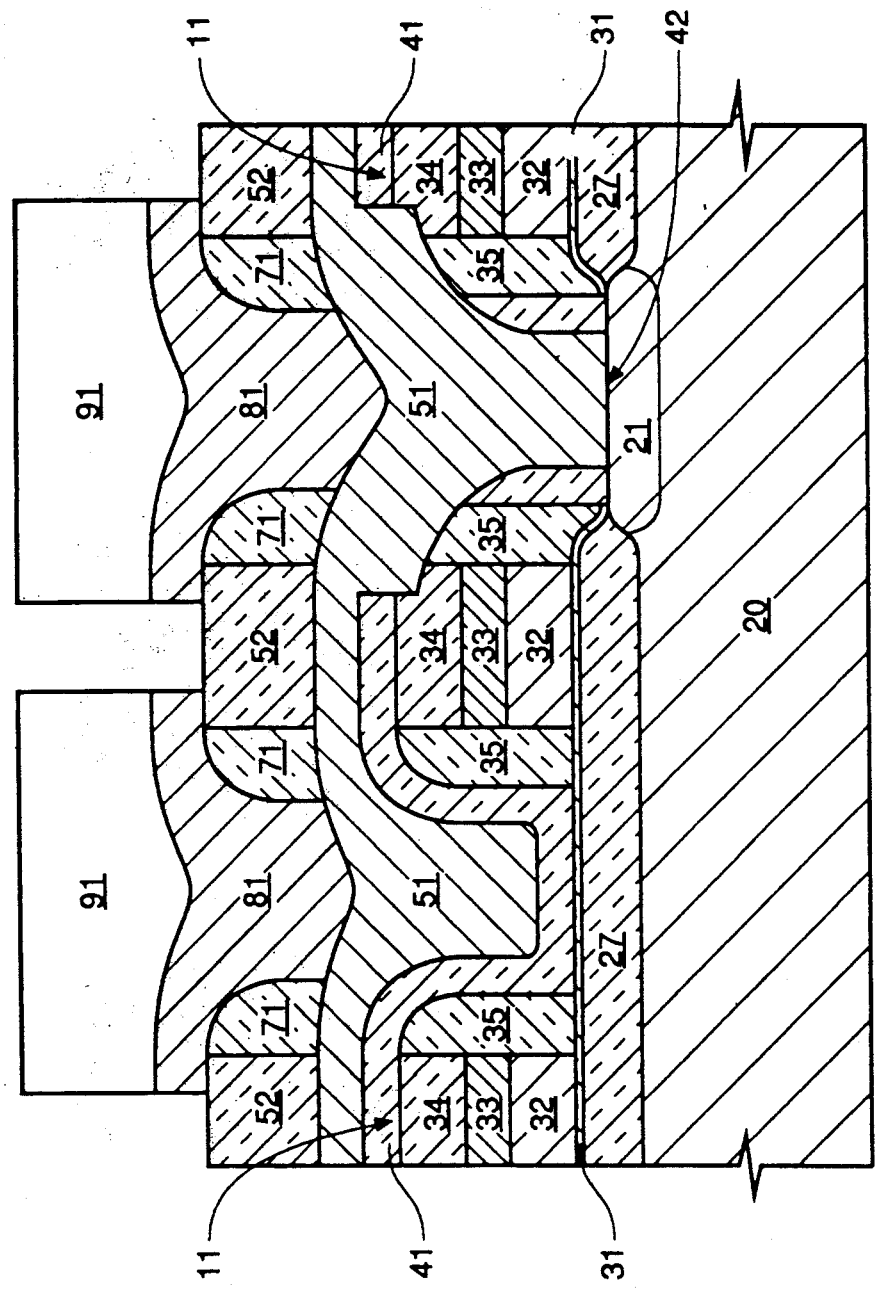
FIG. 9 is a cross-sectional view of the in-process wafer portion of FIG. 8 after patterning and etch of said second polysilicon followed by a wet oxide etch.

As shown in FIG. 9, after applying an appropriate photomask to photoresist 91, polysilicon 81 is patterned and etched thereby exposing the underlying oxides 52 and 71 (seen in FIG. 8). A wet oxide etch then follows to remove oxide 52 and oxide spacers 71. As can be seen in this view the height that polysilicon extends upward from polysilicon 51 is determined by the thickness of previously deposited and patterned oxide 52.

Figure 10A:
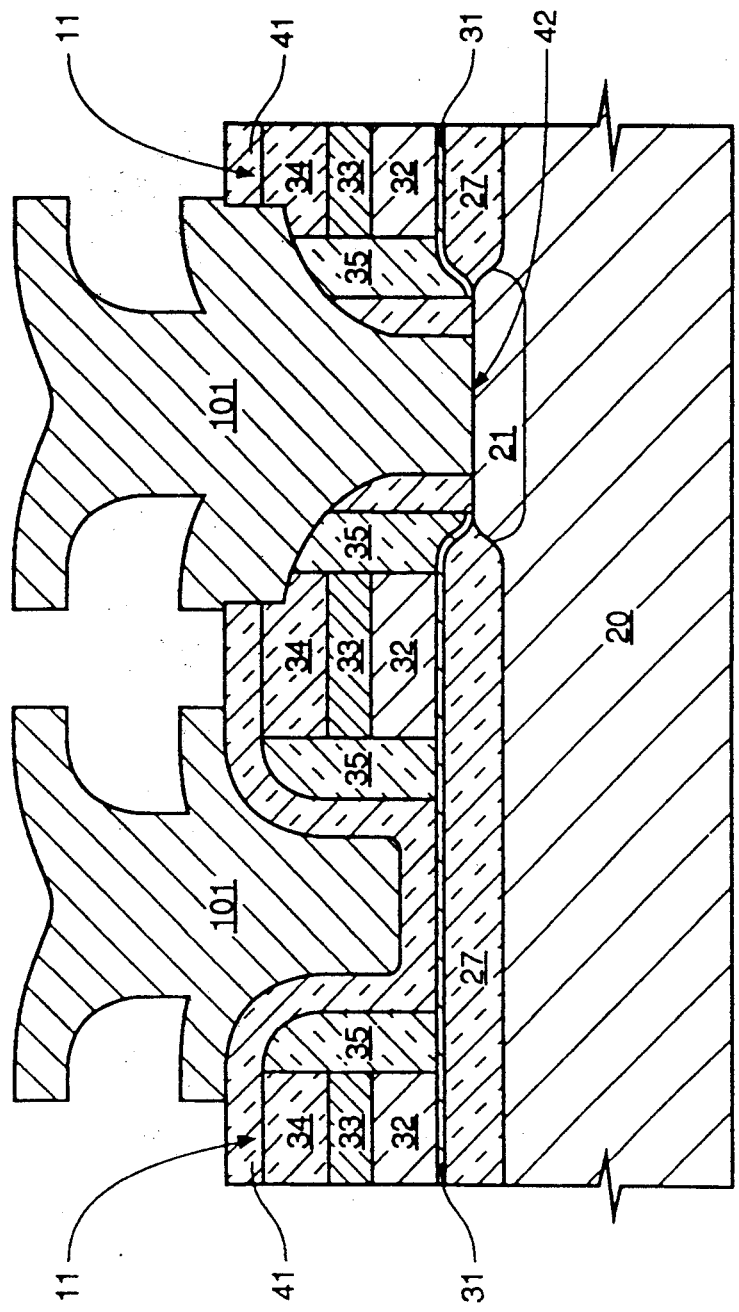
FIG. 10a is a cross-sectional view of the in-process wafer portion of FIG. 9 following a first polysilicon etch and a photoresist strip.

As shown in FIG. 10a, a polysilicon dry etch is performed on polysilicon 51 to separate poly layers 51 and 81 into individual poly structures having I-shaped cross-sections. Each structure will serve as a poly storage node plate 101 having an I-shaped cross-section. An individual poly plate 101 runs parallel between two adjacent digit lines and spans three adjacent poly word lines (the word line is not shown as it runs parallel to the cross-sectional view of FIG. 10a) thereby conforming to the waveform-like topology created by digit line and word line formations.

Figure 10B:
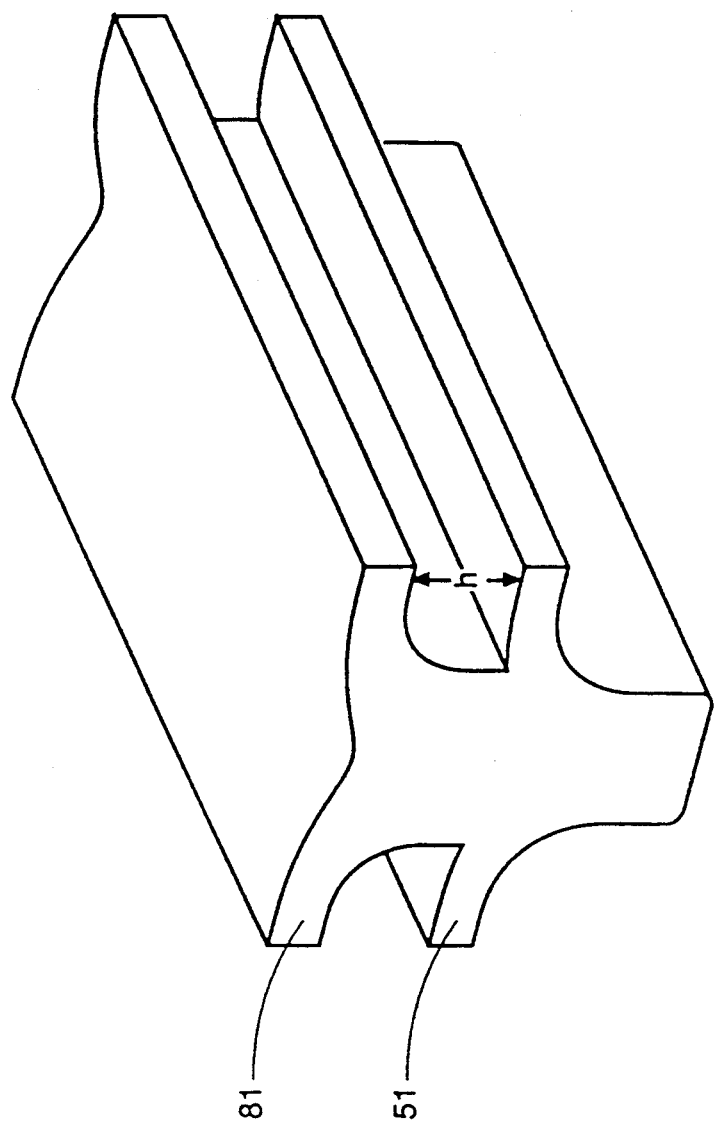
FIG. 10b is a three-dimensional view of a storage node cell plate developed by the present invention.

FIG. 10b shows a 3-dimensional view of a complete poly storage node plate 101. This view demonstrates how surface area is controlled by adjusting the height between poly 51 and 81. Once again, the height is controlled by the thickness of sacrificial oxide layer 52 shown in FIG. 8.

Figure 11:
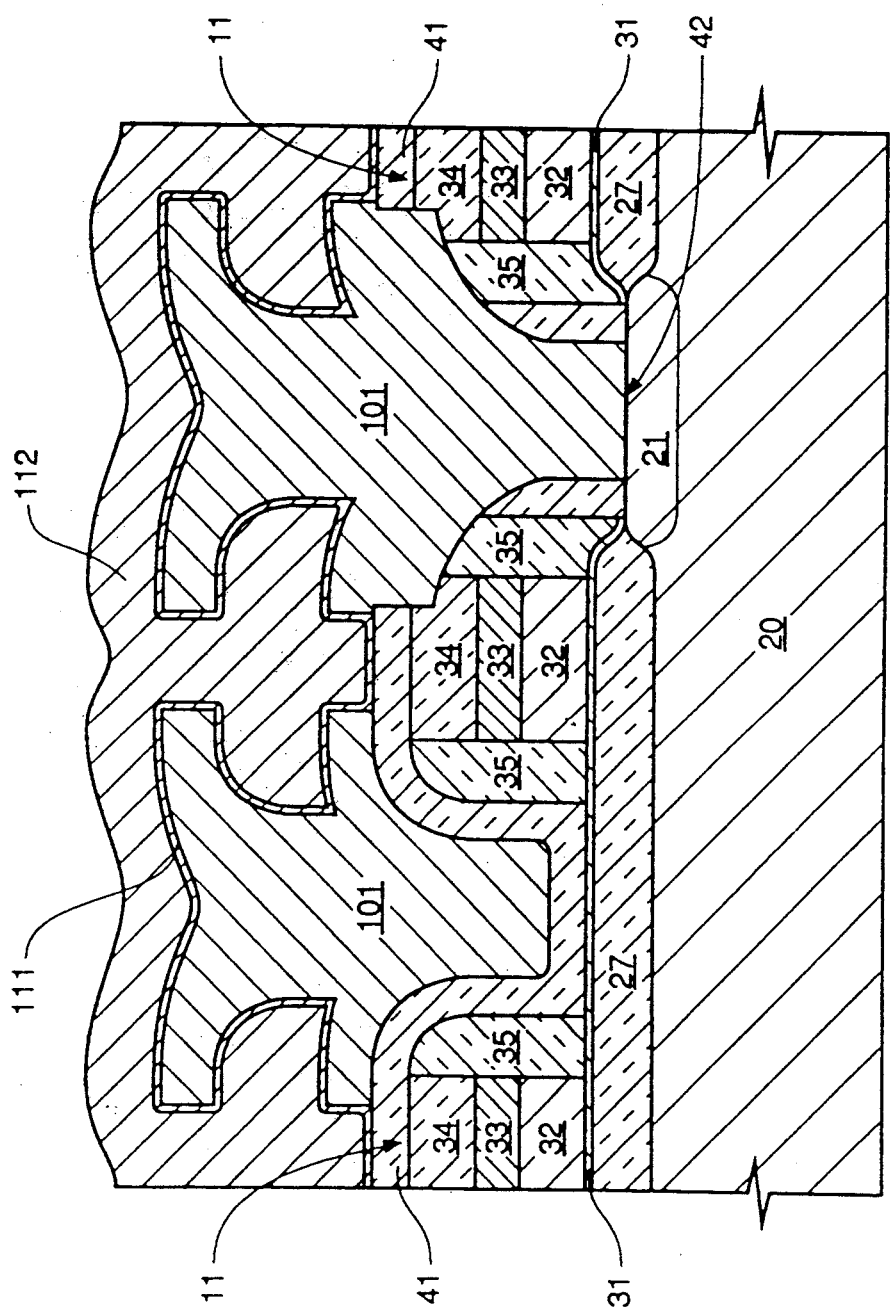
FIG. 11 is a cross-sectional view of the in-process wafer portion FIG. 10a following blanket depositions of a conformal cell dielectric and a third polysilicon.

As shown in FIG. 11, a dielectric layer of nitride 111 deposited that conforms to poly storage node plate 101. Nitride 111 serves as a capacitor dielectric for the SIC. Although nitride 111 is selected as the capacitor dielectric in the preferred embodiment any material having a high dielectric constant such as $Ta_2O_5$ or $SrTiO_3$ could be used. Also, the nitride or $Ta_2O_5$ layers can be oxidized. Following nitride 111 deposition, a blanket deposition of conformal poly 112 is deposited. Poly 112 is conductively doped either n-type or p-type depending on the conductivity type desired for active area 21. Poly 112 now serves as a top poly capacitor cell plate of the SIC storage capacitor which also becomes a common cell plate to all SIC storage capacitors in the array. All conformal polysilicon layers used to create the SIC capacitor are preferably deposited by CVD although other conformal deposition methods could be used as well.

With the unique shape of poly storage node plate 101 along with top poly capacitor cell plate 112 that envelops plate 101, substantial capacitor plate surface area is gained at the storage node. Since capacitance is mainly effected by the surface area of a capacitor's cell plates the additional area gained by a 3-dimensional I-shaped cell structure can provide an additional 200% or more increase in capacitance over that of a conventional STC capacitor, without more space than that required for defining a stacked capacitor storage cell. Higher density for a given capacitance is possible as a smaller cell area is realized.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the steps of:

creating a plurality of separately isolated active areas arranged in parallel rows and parallel columns;

creating a gate dielectric layer on top of each active area;

depositing a first conductive layer superjacent surface of said DRAM array;

depositing a first dielectric layer superjacent said first conductive layer;

masking and etching said first conductive and said first dielectric layers to form a plurality of parallel conductive word lines aligned along said rows such that each said work line passes over a inner portion of each said active area being separated therefrom by a remanent of said gate dielectric layer;

creating a conductively-doped digit line junction and storage node junction within each said active area on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-shaped topology;

depositing a first oxide layer superjacent said array surface of said waveform-shaped topology;

creating a second aligned buried contact location at each said storage node junction in each said active area;

depositing a third conductive layer superjacent said array surface said waveform-shaped topology in response to existing topology, said third conductive layer making contact to said storage node junctions at said second buried contact locations;

etching back said third conductive layer thereby forming a planarized of said third conductive layer;

depositing a fourth dielectric layer superjacent said third conductive layer;

masking and etching said fourth dielectric layer thereby forming dielectric patterns aligned directly over said digit lines;

depositing a fifth dielectric layer superjacent said dielectric patterns and exposed third conductive layer;

etching said fifth dielectric layer thereby forming dielectric spacers adjacent said dielectric patterns, said spacer etching re-exposing a portion of said third conductive layer;

depositing a fourth conductive layer superjacent said dielectric patterns and said dielectric spacers, said fourth conductive layer attaching to surface of said re-exposed third conductive layer;

masking and etching said fourth conductive layer, said etching exposing underlying dielectric;

wet etching said exposed underlying dielectric thereby exposing said third conductive layer;

etching said third conductive layer thereby creating individual conductive storage node plates having said I-shaped cross-section;

depositing a cell dielectric layer adjacent said coextensive said storage node plate and adjacent said array surface; and depositing a fifth conductive layer adjacent and coextensive said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of silicide and doped polysilicon.

4. A process as recited in claim 3, wherein said silicide layer is selected from the group consisting of tungsten silicide and titanium silicide.

5. A process as recited in claim 1, wherein said first, said second and said third dielectric layers are selected from the group consisting of oxide and nitride.

6. A process as recited in claim 1, wherein said fourth and said fifth dielectric layers are oxide.

7. A process as recited in claim 1, wherein said first and said second buried contacts are self aligned.

8. A process as recited in claim 1, wherein said third, said fourth and said fifth conductive layers are doped polysilicon.

9. A process as recited in claim 8, wherein said doped polysilicon is deposited by chemical vapor deposition.

10. A process as recited in claim 1, wherein said first, said second, said third, said fourth and said fifth dielectric layers are deposited by chemical vapor deposition.

11. A process as recited in claim 1, wherein said cell dielectric layer is selected from the group consisting of nitride, oxidized nitride, $Ta_2O_5$, oxidized $Ta_2O_5$ and $SrTiO_3$.

12. A process for fabricating a DRAM storage capacitor on a silicon substrate having active areas, word lines and digit lines, said process comprising the following sequence of steps:

depositing a first dielectric layer on surface of said silicon, said first dielectric layer conforming to existing topology;

masking and etching an aligned buried contact location allowing access to a conductively doped storage node junction;

depositing a first conductive layer superjacent said silicon surface said a waveform-shaped topology in response to existing topology, said first conductive layer making contact to said storage node junctions at said aligned buried contact locations;

etching back said first conductive layer thereby forming a planarized surface of said first conductive layer;

depositing a second dielectric layer superjacent said first conductive layer;

masking and etching said second dielectric layer thereby forming dielectric patterns aligned directly over said digit lines;

depositing a third dielectric layer superjacent said dielectric patterns and exposed first conductive layer;

etching said third dielectric layer thereby forming dielectric spacers adjacent said dielectric patterns, said spacer etching re-exposing a portion of said first conductive layer;

depositing a second conductive layer superjacent said dielectric patterns and said dielectric spacers, said second conductive layer attaching to surface of said re-exposed first conductive layer;

masking and etching said second conductive layer, said etching exposing underlying dielectric;

wet etching said exposed underlying dielectric thereby exposing said first conductive layer;

etching said first conductive layer thereby creating individual conductive storage node plates having said I-shaped cross-section;

depositing a cell dielectric layer adjacent and coextensive said storage node plate; and depositing a third conductive layer adjacent and coextensive said cell dielectric layer to form a cell plate of said storage capacitor.

13. A process as recited in claim 12, wherein said first, said second and said third dielectric layers are oxide.

14. A process as recited in claim 12, wherein said buried contact is self aligned.

15. A process as recited in claim 12, wherein said first, said second and said third conductive layers are doped polysilicon.

16. A process as recited in claim 12, wherein said doped polysilicon is deposited by chemical vapor deposition.

17. A process as recited in claim 12, wherein said first, said second and said third dielectric layers are deposited by chemical vapor deposition.

18. A process as recited in claim 12, wherein said cell dielectric layer is selected from the group consisting of nitride, oxidized nitride, $Ta_2O_5$, oxidized $Ta_2O_5$ and $SrTiO_3$.

* * * * *